United States Patent [19]
Gaultier

[11] Patent Number: 5,651,128
[45] Date of Patent: Jul. 22, 1997

[54] PROGRAMMABLE INTEGRATED CIRCUIT MEMORY COMPRISING EMULATION MEANS

[75] Inventor: Jean-Marie Gaultier, Rousset, France

[73] Assignee: SGS-Thomson Microelectronics, S.A., Gentilly, France

[21] Appl. No.: 484,873

[22] Filed: Jun. 7, 1995

[30] Foreign Application Priority Data

Jul. 20, 1994 [FR] France .................................. 94 09202

[51] Int. Cl.$^6$ .................................................. G06F 12/06
[52] U.S. Cl. .......................................... 395/430; 395/481
[58] Field of Search .................................. 395/500, 430, 395/481; 365/185.02, 201, 185.33; 371/10.2, 21.1

[56] References Cited

U.S. PATENT DOCUMENTS

| | | | |
|---|---|---|---|
| 5,151,881 | 9/1992 | Kajigaya et al. | |
| 5,222,046 | 6/1993 | Kreifs | 395/185.22 |
| 5,224,070 | 6/1993 | Fandrich | 365/185.33 |
| 5,357,472 | 10/1994 | Shirota | 365/201 |
| 5,410,544 | 4/1995 | Kreifs | 395/183.07 |
| 5,509,134 | 4/1996 | Fandrich | 395/430 |
| 5,539,699 | 7/1996 | Sato | 363/201 |

FOREIGN PATENT DOCUMENTS

| | | |
|---|---|---|
| 0385591 | 5/1990 | European Pat. Off. |
| 5290185 | 2/1994 | Japan |

*Primary Examiner*—Tod R. Swann
*Assistant Examiner*—Christopher S. Chow
*Attorney, Agent, or Firm*—Robert Groover; Betty Formby; Matthew Anderson

[57] ABSTRACT

The integrated circuit memory has a matrix of cells and a plurality of circuits enabling the selective application, to the cells, of programming and erasure potentials. These circuits are controlled by an integrated state machine programmed to perform algorithms adapted to the operations to be performed. In order to facilitate the devising and perfecting of these algorithms, the memory includes selection means enabling an external tester to be substituted for the state machine. A particularly advantageous application is in "FLASH EEPROM" memories.

25 Claims, 1 Drawing Sheet

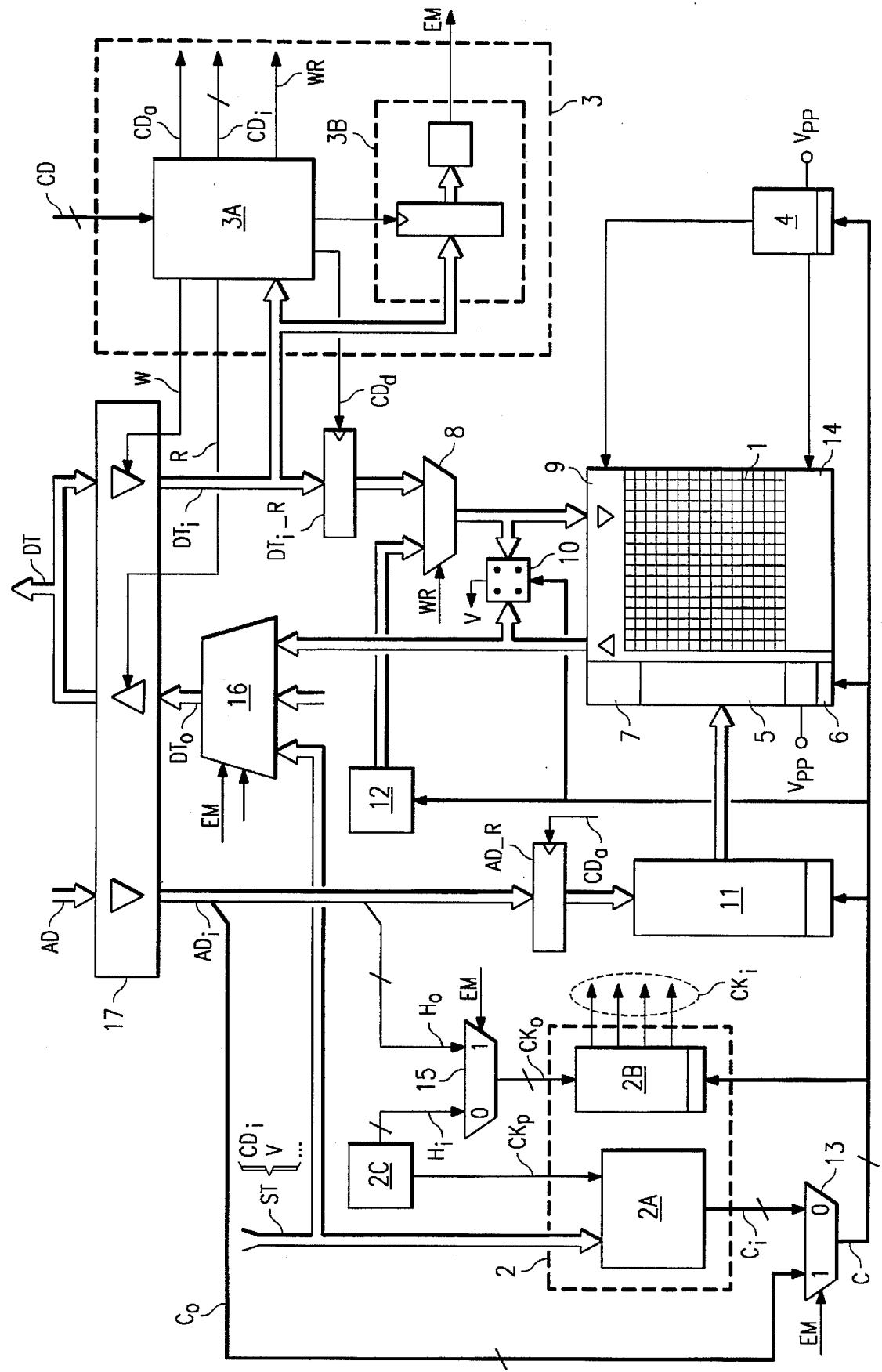

PROGRAMMABLE INTEGRATED CIRCUIT MEMORY COMPRISING EMULATION MEANS

CROSS-REFERENCE TO RELATED APPLICATION

This application claims priority from French App'n 94-09202, filed Jul. 20, 1994, which is hereby incorporated by reference. However, the content of the present application is not necessarily identical to that of the priority application.

BACKGROUND AND SUMMARY OF THE INVENTION

The invention pertains chiefly to the field of programmable integrated memories such as EEPROM or FLASH EEPROM type memories.

The memories of this type that are currently being developed take the form of integrated circuits containing a set of resources that enable the programming and, if necessary, the erasure of the memory cells. These resources are notably programming and erasure voltage generators, circuits for the checking of the programmed or erased data elements by re-reading or address generators used for the automatic erasure of the entire memory or of certain selected sectors. These resources are controlled by an integrated control unit capable of performing algorithms adapted to the operations to be carried out and to the resources controlled.

The control unit is a state machine that can be constituted by means of a programmable logic array (PLA) or a microprogrammed unit. For reasons of space requirements, the state machine is generally wired.

The consequence of this is that the algorithms that can be performed by the state machine cannot be modified after the manufacture of the integrated circuit.

The devising and perfecting of such products is made easy by simulation programs applicable to the technology used. However, these programs are not an exact reflection of reality and therefore do not make it possible to do without the real tests to which prototypes are subjected. Typically, these tests consist of performing a succession of programming and erasure operations followed by re-reading operations used to detect the discrepancies between the data elements that should have been written and the data elements read. These tests can also be carried out by subjecting the memory to extreme operating conditions, for example, by placing the memory in an oven.

These tests are aimed of course at detecting the origin of the defects observed in order to modify certain design or manufacturing parameters accordingly.

Thus, the presently used designing methods generally call for the manufacture of several series of prototypes incorporating successive improvements resulting from the analyses of the tests made.

The search for the causes of the defects observed is made possible by integrated test modes enabling notably the extraction, from the memory, of the indicators representing the logic state of the main circuits that constitute it. For certain types of defects, such as those related to manufacturing variations and ageing, improvements can be obtained simply by a modification of the algorithms that can be performed by the state machine. However, many prototypes may have to be manufactured in order to enable the necessary modifications to be determined in an optimum way. This results in an increase in the cost and time taken to develop such products.

The invention is aimed at overcoming this drawback by proposing a memory designed to operate in an emulation mode enabling a tester, external to the integrated circuit, to be substituted for the state machine. This arrangement will then make it possible to test new algorithms without its being necessary to manufacture corresponding prototypes.

To this end, an object of the invention is a programmable integrated circuit memory comprising:

a matrix of addressable memory cells, supply means designed for the selective application of the programming and erasure voltages to said memory cells as a function of internal control signals conveyed by internal control lines, an interface circuit connected to external data and address lines to exchange data elements and to transfer external address signals to corresponding internal lines, a user's control unit receiving external control signals and designed notably to control said exchange of data elements as a function of said external control signals, a state machine designed to perform at least one algorithm that can be activated by the user's control unit as a function of the external control signals received, the performance of said algorithm having the effect of producing output signals, wherein said memory comprises detection means sensitive to predetermined external control signals and first selection means controlled by said detection means to make the memory work selectively in a normal mode and an emulation mode and wherein said first selection means are designed, in normal mode, to place said output signals of the state machine on said internal control lines and, in emulation mode, to place a part at least of said internal address lines in a state of communication with said internal control lines.

Should the memory be provided with a sequencer and an integrated clock, it is generally necessary to synchronize the sequencing of the algorithm by means of one and the same clock signal as the one used to synchronize the sequencer. To this end, it is possible to provide for the possibility of extracting the basic clock signal from the integrated circuit in order to transmit it to the tester. However, in emulation mode, it is preferable to synchronize the memory by means of a clock signal given by the tester.

Thus, according to another aspect of the memory of the invention, there is provided a memory wherein said state machine comprises a sequencer synchronized by at least one basic clock signal and wherein second selection means controlled by said detection means are designed to deliver said basic clock signal or signals selectively by means of an internal clock in normal mode and on the basis of at least one of said internal address lines in emulation mode.

This approach has the advantage of simplifying the checking of the exchanges between the tester and the integrated circuit. Furthermore, it can be used to carry out tests by modifying the basic clock frequency.

Should the state machine be provided with input terminals designed to receive input signals from at least one of the circuits of the memory, the invention further provides for third selection means controlled by said detection means and designed, in emulation mode, to give said input signals to said interface circuit with a view to placing them on said external data lines.

Advantageously, the interface circuit and the first, second and third selection means are designed to enable real-time operation.

Should the state machine be designed to control a plurality of circuits of the memory, it is also provided, according to the invention, that the internal control lines will constitute a control bus and that at least a part of the control circuits will be provided with decoders connected to the bus so that the number of lines constituting the control bus is not greater than the number of internal address lines.

The latter arrangement also enables an implementation of the emulation mode without its being necessary to provide for additional external lines or to use the external data lines.

BRIEF DESCRIPTION OF THE DRAWING

The disclosed inventions will be described with reference to the accompanying drawings, which show important sample embodiments of the invention and which are incorporated in the specification hereof by reference, wherein:

Other aspects and advantages of the invention shall appear in the rest of the description.

The single FIGURE represents a general diagram of a memory according to the invention.

DETAILED DESCRIPTION OF THE PREFERRED EMBODIMENTS

The numerous innovative teachings of the present application will be described with particular reference to the presently preferred embodiment (by way of example, and not of limitation), in which:

As a non-restrictive example, the memory shown in the figure is of the FLASH EEPROM type.

The memory is essentially formed by a matrix 1 of memory cells organized in rows and columns. The rows are selected by means of a row decoder 5 while the columns are selected by means of a column decoder 7 associated with a selection circuit 9. The row and column decoders receive an address given by an address generator 11.

In the case of a FLASH EEPROM type memory, each memory cell is formed by a floating-gate MOS transistor whose conduction threshold can be modified by the application of appropriate voltage to its electrodes.

Thus, the programming of the cell consist of creating a high threshold by the application of programming voltage to the gate and to the drain, the source being grounded. Conversely, an erasure operation consist of creating a low threshold by the application of an erasure voltage to the source of the transistor, its gate being grounded and its drain being placed in the high-impedance state. Thus, for this type of memory, there is provided a generator 4 of column programming voltages supplying the drains by means of the column selection circuit 9 and supplying the sources by means of a source supply circuit 14. There is furthermore provision for a row supply circuit 6 enabling the application of the programming voltage to the gates.

These supply means receive a potential Vpp, called a high voltage, given by the exterior of the integrated circuit.

The memory communicates with the exterior by means of an interface circuit 17 connected to address lines AD and data lines DT. The interface circuit 17 enables the transfer of the external address signals AD to internal address lines ADi connected to the address generator 11 by means of an address register AD-R. The data elements exchanged between the matrix 1 and the exterior by the lines DT go through by means of lines DTi and a register of input data DTi-R and a multiplexer or data selector 8 for the writing operation and by means of output data lines DTo and another multiplexer 16 for the reading operation. The multiplexer 8, the output of which is connected to the column selection circuit 9 by writing lines has a second input connected to a data generator 12. The column selector 9 is furthermore connected to an input of the multiplexer 16 by reading lines. The writing and reading lines are connected to the inputs of a comparator 10 giving a comparison signal V at output.

The memory furthermore has a user's control unit 3 receiving external control signals CD. The unit 3 is essentially formed by a control interface 3A and a test circuit 3B. The control interface 3A directly receives the external control signals CD and is furthermore connected to the input data lines DTi.

The interface 3A is designed to take account of the external control signals CD and to interpret them as a function of data elements placed on the data lines DT. Depending on this interpretation, the interface 3A gives control signals CDa, CDi, W, R, CDd.

The memory furthermore has a state machine 2 associated with a clock 2C. The state machine 2 is constituted by a programmable logic array (PLA) 2A and a sequencer 2B giving timing signals CKi. The programmable logic array 2A receives input signals ST as well as a clock signal CKp given by the clock 2C. It delivers control signals Ci on an internal control bus C by means of a multiplexer 13 whose second input is connected to a part Co of the internal address lines ADi. The bus C is connected to the sequencer 2B, the address generator 11, the data generator 12, the comparator 10, the row supply circuit 6 and the column supply voltage generator 4. The input signals ST are constituted by control signals CDi given by the interface 3A as well as a set of variables relating to the state of the different resources of the circuit. The signals ST are applied to one of the inputs of the multiplexer 16.

The sequencer 2B is synchronized by a basic clock signal CK0 given by a multiplexer 15 whose input receives one or more clock signals Hi given by the clock 2C and whose second input is connected to a part Ho of the internal address lines ADi.

The test circuit 3B has a register whose input is connected to the input data lines DTi. Its output is connected to a decoder giving an emulation mode detection signal EM. The register is controlled by the control interface 3A. The emulation mode detection signal EM is a control signal for the multiplexers 13, 15, 16.

The second input of the multiplexer 13 is connected to a part CO of the internal address lines ADi.

Depending on the state of EM, the memory is positioned to work either in normal mode or in emulation mode. In normal mode, the multiplexers 13, 15, 16 respectively permit the transfer of the signals Ci to the bus C, the signals Ho to the sequencer 2B, and the signals of the reading lines towards the lines DTo.

In a standard way, the memory is designed to carry out operations of reading, writing and total or sector-wise erasure of the memory map. In the example shown, these operations are activated as a function of the external control signals CD and of associated data elements present on the lines DT. In response to the external command received, the interface 3A gives the appropriate signals such as the signal CDa controlling the loading of the address register AD-R as well as the signal CDd controlling the loading of the input data register DTi-R if the operation is a writing operation. The interface 3A furthermore gives the control signals CDi to the programmed logic array 2A so as to activate the performance of the algorithm corresponding to the operation to be carried out.

According to a particular embodiment, the user's control unit 3 will be designed to work in two successive stages: a first stage during which the exterior gives a prepositioning command that enables the interface 3A to identify the type of command (reading, writing, erasure) and a second stage during which the exterior gives an execution command associated with the performance parameters (address, data to be written). During the second stage, the interface 3A controls the loading of these performance parameters into the corresponding registers (AD-R, DTi-R). Simultaneously, the interface 3A gives the appropriate commands CDi to the state machine 2.

Thus, for a writing operation, an address is loaded into the address register AD-R and the data to be written is loaded into the register DTi-R. The address generator 11 is positioned to place the register AD-R in a state of communication with the decoders 5 and 7. The data selector 8 is positioned by the signal WR so that the register DTi-R controls the column selector 9 in such a way that, depending on the data element to be written, a programming voltage is applied to the drains of the cells selected by the address. The state machine then performs the algorithm corresponding to a write operation. The algorithm will consist, for example, in activating the supply circuit 6 so as to apply a calibrated programming pulse to the gates of the transistors of the selected row. A reading operation is then performed to compare the conduction state of the cells to be programmed with a reference programmed cell. The divergence values are reported to the state machine 2 by the comparator 10 by means of the comparison signal V which constitutes one of the input signals ST referred to here above. In the event of divergence, the algorithm again prompts a programming pulse at the gates. A new reading operation and a new comparison are then carried out to determine whether a new programming pulse is needed. This cycle is repeated as many times as a difference is detected.

An operation to erase the memory is performed by carrying out two successive algorithms: a pre-erasure programming algorithm and an erasure algorithm proper. The data selector 8 is positioned to enable the data generator 12 to control the column supply circuit 9. To carry out the pre-erasure programming algorithm, the state machine controls the data generator 12 so that, at output, it gives a logic value corresponding to the programmed state of the cells. The state machine furthermore controls the address generator so that it places the row and column decoders in a state of communication with an address counter (not shown) initially at zero. The state machine 2 then activates a programming cycle which, first of all, commands the supply circuit 6 to give a programming pulse to the gates. Then, as with the writing, the data elements are read and compared to determine whether a new programming pulse is necessary. If this is the case, a new programming pulse is given. The programming cycles are thus repeated until the comparator 10 no longer detects any difference. The state machine 3 then gives the address generator 11 an incrementation command signal so as to increase the address applied to the decoder 5 and 7 by one unit. The state machine then activates new programming cycles in the manner indicated here above. At the end of these cycles, the counter is again incremented. The operation gets repeated in this way until the counter gives an overflow signal constituting a state signal transmitted to the state machine.

In response to this state signal, the state machine gets branched into an erasure algorithm which then consists first of all in controlling the data generator 12 so that, at output, it gives a logic value corresponding to the erased state of the cell. It then controls the voltage generator 4 so that it supplies the sources with an erasure voltage.

The algorithm continues with a succession of reading and comparison operations aimed at comparing the state of conduction of the cells to be erased with an reference erased cell. In the event of a difference, the erasure voltage is again applied to the sources and all the cells are again subjected to a methodical verification. This cycle is repeated for as long as a difference is detected by the comparator 10.

To make the memory work in emulation mode, a particular control signal CD is applied for placing the system in test mode, this signal being associated with data elements DT identifying the emulation mode. In response to this control signal, the interface 3A activates the loading of the data elements into the corresponding register of the test circuit 3B. The decoder then give the emulation mode control signal EM.

The multiplexer 13 is then positioned to place the lines CO in a state of communication with the internal control bus C. Similarly, the multiplexer 15 is positioned to deliver the basic clock signal CK0 from internal address lines H0. Finally, the multiplexer 16 is positioned to place the input signals ST on the internal output lines DTo.

Furthermore, to place the output of the multiplexer 16 in a state of communication with the external data lines DT, an external reading control signal is applied in order to activate the output amplifiers of the interface 17.

It is then possible to use a tester connected to the lines AD and DT. This tester could then be programmed to carry out the algorithms that are to be developed.

By then applying the normal writing or erasure commands, the control interface 3A generates the corresponding signals CDi. These signals are then transmitted to the tester by the multiplexer 16 and the external data lines DT. The tester then performs the corresponding algorithm, the effect of which is the sending of a command on the bus C by means of the lines D and ADi and the multiplexer 13. Simultaneously, the tester sends the basic clock signal CKo by means of the lines AD and ADi and the multiplexer 15.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. An integrated circuit comprising:
   an array of nonvolatile memory cells;
   read interface circuitry, connected to read out a selected one of said cells, as selected by an address signal received on address lines, and to output corresponding data on data lines;
   automatic control circuitry, connected to selectably drive on-chip control lines to activate internal elements which perform nonvolatile data modification operations on said cells, in accordance with data received on said data lines;
   a multiplexer, connected to selectably intercept said on-chip control lines and thereupon replace outputs of said control circuitry with signals received on said address lines; and
   emulation mode entry logic, connected to selectively direct said multiplexer to intercept said on-chip control lines at the output of said control circuitry.

2. The integrated circuit of claim 1, wherein said data and address lines are separate.

3. The integrated circuit of claim 1, wherein said address lines are externally accessible.

4. The integrated circuit of claim 1, wherein at least one of said control lines is connected to activate write circuitry, and at least one of said control lines is connected to activate erase circuitry.

5. A programmable integrated circuit memory comprising:

a matrix of addressable memory cells, supply means designed for the selective application of the programming and erasure voltages to said memory cells as a function of internal control signals conveyed by internal control lines, an interface circuit connected to external data and address lines to exchange data elements and to transfer external address signals to corresponding internal lines, a user's control unit receiving external control signals and designed to control said exchange of data elements as a function of said external control signals, a state machine designed to perform at least one algorithm that can be activated by the user's control unit as a function of the external control signals received, the performance of said algorithm having the effect of producing output signals, detection means sensitive to predetermined external control signals, and first selection means controlled by said detection means to make the memory work selectively in a normal mode and an emulation mode and wherein said first selection means are designed, in normal mode, to place said output signals of the state machine on said internal control lines and, in emulation mode, to place a part at least of said internal address lines in a state of communication with said internal control lines.

6. A memory according to claim 5, wherein said state machine being provided with input terminals designed to receive input signals from at least one of the circuits of the memory, there are provided third selection means controlled by said detection means to give, in emulation mode, said input signals to said interface circuit which places them on said external data lines.

7. memory according to claim 6, wherein said interface circuit and said first, second and third selection means are designed to enable real-time operation.

8. A memory according to claim 5 wherein, said state machine being designed to control a plurality of circuits of the memory, said internal control lines constitute a control bus and at least a part of said control circuits are provided with decoders connected to said bus so that the number of lines constituting said bus is not greater than the number of internal address lines.

9. A memory according to claim 5 wherein, in normal mode, said user's control unit is designed to work in response to two successive commands:

a prepositioning command in response to which the user's control unit identifies the type of operation to be performed, such as the erasure or the programming of cells of the matrix and an execution command in response to which the user's control unit activates the loading, into at least one internal register of execution parameters, such as the address or the data elements to be written, of the operation to be performed, said predetermined external control signals being applied before said prepositioning command.

10. An integrated circuit, comprising: an array of nonvolatile memory cells;

selection circuitry to decode address inputs to provide address outputs defining at least one selected one of said cells;

read interface circuitry connected to selectably read out data from the selected one of said cells;

programming circuitry connected to selectably program the selected one of said cells;

a state machine operatively connected to receive control inputs and accordingly to provide control signal outputs to said programming circuitry;

bypass logic, connected to said state machine, and configured to intercept and replace said control signal outputs with externally received data; and test mode logic connected to said bypass logic to selectively provide an emulation mode whereby externally received control signals perform data modifications.

11. The integrated circuit of claim 10, wherein said state machine controls a plurality of circuits of the memory to produce a control bus comprising the internal control lines of the memory.

12. The integrated circuit of claim 10, wherein said array is of the FLASH EEPROM type.

13. The integrated circuit of claim 10, wherein said state machine comprises a sequencer synchronized by a clock signal, said clock signal being selectably provided by an external clock in said emulation mode.

14. The integrated circuit of claim 10, wherein the memory further comprises erasure circuitry connected to said selection circuitry to erase said cells.

15. An integrated circuit, comprising:

an array of nonvolatile memory cells;

selection circuitry to decode address inputs to provide address outputs defining at least one selected one of said cells;

read interface circuitry connected to selectably read out data from the selected one of said cells;

programming circuitry connected to selectably program the selected one of said cells;

a state machine operatively connected to receive control inputs and accordingly to provide control signal outputs to said programming circuitry;

bypass logic, connected to said state machine, and configured to intercept and replace said control signal outputs with externally received data;

clock bypass logic operatively connected to said state machine to selectably synchronize a sequencer from an externally received clock signal; and test mode logic connected to said bypass logic to selectively provide an emulation mode whereby externally received control signals perform data modifications.

16. The integrated circuit of claim 15, wherein said state machine controls a plurality of circuits of the memory to produce a control bus comprising the internal control lines of the memory.

17. The integrated circuit of claim 15, wherein said array is of the FLASH EEPROM type.

18. The integrated circuit of claim 15, wherein said state machine comprises a sequencer synchronized by a clock signal, said clock signal being selectably provided by an external clock in said emulation mode.

19. The integrated circuit of claim 15, wherein the memory further comprises erasure circuitry connected to said selection circuitry to erase said cells.

20. An integrated circuit, comprising:

an array of nonvolatile memory cells;

selection circuitry to decode address inputs to provide address outputs defining at least one selected one of said cells;

read interface circuitry connected to selectably read out data from the selected one of said cells;

programming circuitry connected to selectably program the selected one of said cells;

external interface circuitry connected to external address and data lines to exchange data signals and transfer external address signals to said programming circuitry;

a state machine operatively connected to receive control inputs and accordingly to provide control signal outputs to said programming circuitry;

bypass logic, connected to said state machine, and configured to intercept and replace said control signal outputs with externally received data;

clock bypass logic operatively connected to said state machine to selectably synchronize a sequencer from an externally received clock signal;

read bypass logic connected to said read interface circuitry to transfer data to external data lines;

test mode logic connected to said bypass logic to selectively provide an emulation mode whereby externally received control signals perform data modifications.

21. The integrated circuit of claim 20, wherein said state machine controls a plurality of circuits of the memory to produce a control bus comprising the internal control lines of the memory.

22. The integrated circuit of claim 20, wherein said array is of the FLASH EEPROM type.

23. The integrated circuit of claim 20, wherein said state machine comprises a sequencer synchronized by a clock signal, said clock signal being selectably provided by an external clock in said emulation mode.

24. The integrated circuit of claim 20, wherein the memory further comprises erasure circuitry connected to said selection circuitry to erase said cells.

25. A method of operating an integrated circuit memory array, comprising the steps of:

(a.) in a normal mode of operation:

decoding address inputs to provide address outputs to define at least one selected nonvolatile memory cell;

reading data from the selected ones of said cells;

programming the selected ones of said cells;

providing internal control signals from a state machine to enable programming of said cells; and synchronizing a sequencer by an internal clock signal in said state machine to deliver said internal control signals;

(b.) in an emulation mode of operation:

intercepting and replacing said internal control signals with externally received control signals;

synchronizing said sequencer by an externally received clock signal; and transferring data to external data lines.

* * * * *